(12) United States Patent
Koike et al.

(10) Patent No.: US 12,016,208 B2
(45) Date of Patent: Jun. 18, 2024

(54) DISPLAY DEVICE AND METHOD OF MANUFACTURING DISPLAY DEVICE

(71) Applicant: SHARP KABUSHIKI KAISHA, Sakai (JP)

(72) Inventors: Eiji Koike, Sakai (JP); Tohru Sonoda, Sakai (JP); Masahiro Inuzuka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 548 days.

(21) Appl. No.: 17/278,549

(22) PCT Filed: Sep. 28, 2018

(86) PCT No.: PCT/JP2018/036449
§ 371 (c)(1),
(2) Date: Mar. 22, 2021

(87) PCT Pub. No.: WO2020/065963
PCT Pub. Date: Apr. 2, 2020

(65) Prior Publication Data
US 2021/0351252 A1      Nov. 11, 2021

(51) Int. Cl.
| | |
|---|---|
| H01L 27/32 | (2006.01) |
| H01L 51/52 | (2006.01) |
| H10K 50/84 | (2023.01) |
| H10K 59/122 | (2023.01) |

(52) U.S. Cl.
CPC ......... *H10K 59/122* (2023.02); *H10K 50/841* (2023.02)

(58) Field of Classification Search
CPC .... H10K 71/70; H10K 59/122; H10K 59/352; H10K 50/805; H10K 50/14; H10K 50/166; H10K 50/17; H10K 50/171; H10K 50/16; H05B 33/04
See application file for complete search history.

(56) References Cited

U.S. PATENT DOCUMENTS

| | | | | |
|---|---|---|---|---|
| 2014/0027720 A1* | 1/2014 | Kim | ...................... | H10K 71/621 |
| | | | | 257/E51.001 |
| 2016/0343944 A1* | 11/2016 | Lee | ......................... | H10K 59/35 |
| 2018/0151850 A1* | 5/2018 | Lee | ......................... | H10K 59/30 |

FOREIGN PATENT DOCUMENTS

| | | | | | |
|---|---|---|---|---|---|
| CN | 108122957 A | * | 6/2018 | ......... | H01L 27/3206 |
| JP | 2014066536 A | | 4/2014 | | |
| KR | 20180061850 A | * | 6/2018 | ......... | H01L 27/3276 |
| WO | 2014/050319 A1 | | 4/2014 | | |

* cited by examiner

*Primary Examiner* — Victor A Mandala
*Assistant Examiner* — Lawrence C Tynes, Jr.
(74) *Attorney, Agent, or Firm* — ScienBiziP, P.C.

(57) ABSTRACT

A display device includes a display area, a frame area around the display area, and a contact area between the display area and the frame area. In the display area is there provided a light-emitting element layer including an anode, a functional layer, a cathode, and a pixel bank covering an edge of the anode. The cathode is electrically connected to a metal film in the contact area. An insular TEG pattern is provided in the contact area.

20 Claims, 6 Drawing Sheets

DISPLAY DEVICE AND METHOD OF MANUFACTURING DISPLAY DEVICE

TECHNICAL FIELD

The present disclosure relates to display devices and methods of manufacturing display devices.

BACKGROUND ART

The display area of a display device includes a stack of patterned functional layers formed by vapor deposition. Patent Literature 1 describes a TEG (test element group) pattern provided between panel formation areas on the substrate, except in the effective area, to manage a vapor deposition process (film-forming process) for the functional layers. Patent Literature 1 further describes that the condition of each vapor-deposited layer is managed through the measurement of, for example, the thickness or location of the TEG pattern thus formed.

CITATION LIST

Patent Literature

Patent Literature 1: Japanese Unexamined Patent Application Publication, Tokukai, No. 2014-066536 (published Apr. 17, 2014)

SUMMARY

Technical Problem

The invention described in Patent Literature 1, however, only provides the TEG pattern away from the display area in the effective area (panel), therefore falling short of accurately managing the condition of the vapor-deposited functional layer. The invention described in Patent Literature 1 hence have difficulty detecting local defects in the effective area.

The present disclosure, in an aspect thereof, has been made to address these problems and has an object to provide a display device in which the condition of a vapor-deposited functional layer is precisely evaluated and a method of manufacturing such a display device.

Solution to Problem

To address the problems, the present disclosure, in an aspect thereof, is directed to a display device having a display area and a frame area around the display area, the display area including a stack body including: a TFT layer; a light-emitting element layer including an anode, a functional layer, a cathode, and a pixel bank covering from an opening therein to an edge of the anode; and a sealing layer, the sealing layer including at least one organic film, there being provided a partition wall in the frame area, the partition wall being configured to delineate an edge of the organic film, the display device further having, between the display area and the partition wall, a contact area in which the cathode is electrically connected to a metal film made of a same material and in a same layer as the anode, and there being provided an insular TEG pattern in the contact area, the insular TEG pattern being made of a same material as the functional layer.

Advantageous Effects of Disclosure

The present disclosure, in an aspect thereof, provides a TEG pattern in a contact area adjacent to the display area and evaluates the condition of a vapor-deposited functional layer in the display area on the basis of this TEG pattern, thereby evaluating the condition of the vapor-deposited functional layer with improved precision.

BRIEF DESCRIPTION OF DRAWINGS

Portion (a) of FIG. 1 is a schematic plan view of a structure of a display device in accordance with an embodiment, and (b) of FIG. 1 is a cross-sectional view of a display area.

DESCRIPTION OF EMBODIMENTS

Figure 1:
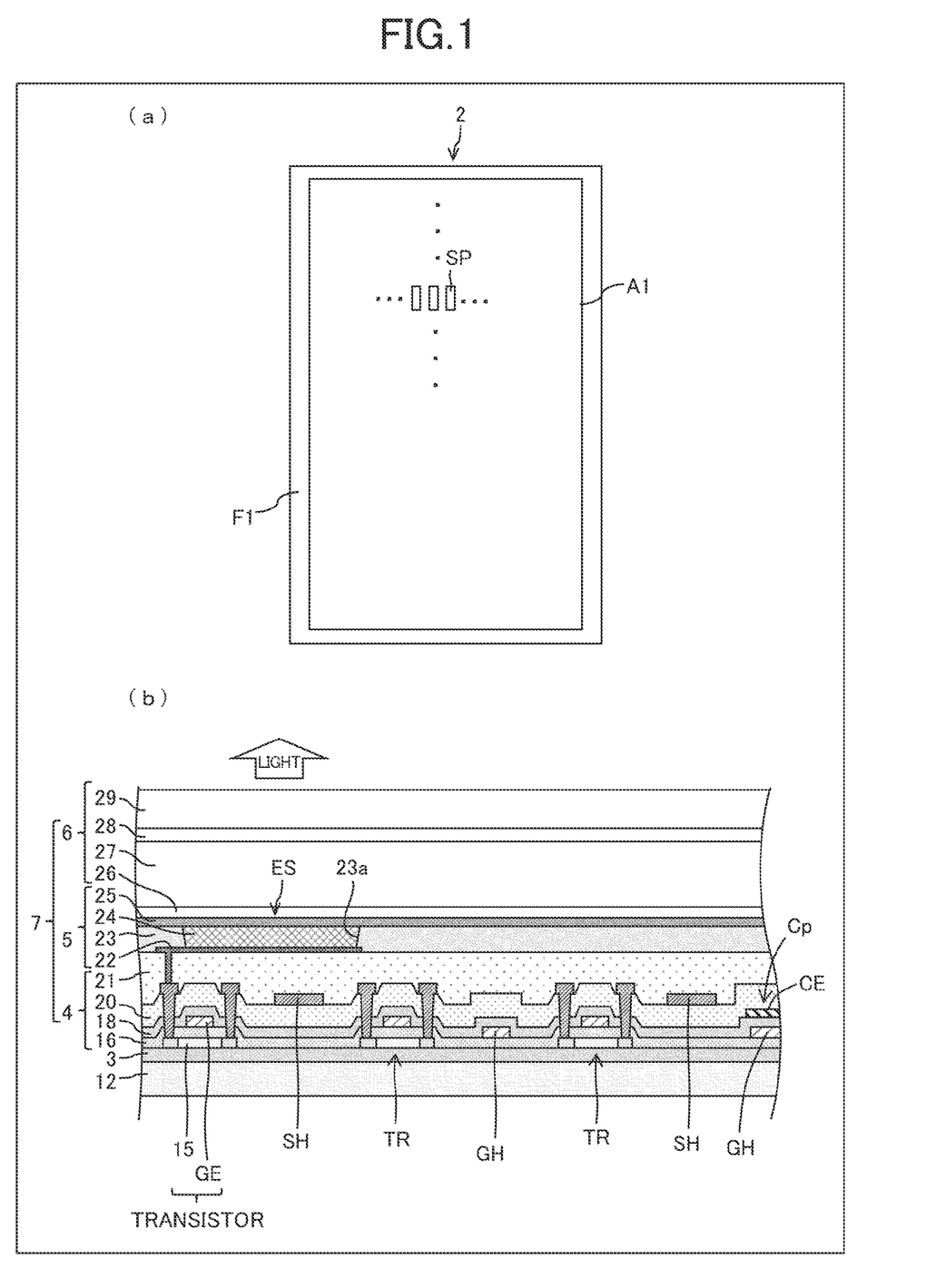

The following will describe in detail an embodiment in accordance with the present disclosure. Portion (a) of FIG. 1 is a schematic plan view of a structure of a display device, and (b) of FIG. 1 is a cross-sectional view of a display area. As shown in FIG. 1, a display device 2 has a display area (active area) A1 and a frame area (non-display area) F1 around the display area A1. In the display area A1 are there provided a plurality of subpixels SP and a plurality of wires or lines (e.g., scan signal lines, data signal lines, light-emission control lines, and EL power supply lines; none of them shown). In the frame area F1, there are provided, for example, various driver circuitry and a terminal section (neither shown). The display area A1 may be notched. A portion of the frame area F1 (e.g., the terminal section) may be bent backwards.

The display device 2 includes a barrier layer 3, a TFT layer 4, a light-emitting element layer 5, a sealing layer 6, and a functional film 29 stacked in this sequence on a base member 12. The base member 12 may be a glass substrate or a flexible resin substrate (e.g., polyimide substrate). The barrier layer 3 prevents foreign material such as water, oxygen, and mobile ions from reaching the TFT layer 4 and the light-emitting element layer 5. The barrier layer 3 is composed of, for example, a film of silicon oxide or silicon nitride formed by CVD or a stack of these films.

The TFT layer 4 includes a semiconductor layer 15, an inorganic insulation film 16, a first metal layer (including gate electrodes GE and gate lines GH), an inorganic insulation film 18, a second metal layer (including capacitor electrodes CE), an inorganic insulation film 20, a third metal layer (including source lines SH), and a planarization film 21 stacked in this sequence. The gate lines GH include, for example, the scan signal lines and the light-emission control lines. The source lines SH include, for example, the data signal lines and the EL power supply lines.

The semiconductor layer 15 may be composed of a low-temperature polysilicon (LTPS) or an oxide semiconductor (e.g., In—Ga—Zn—O-based semiconductor). Each metal layer is a monolayer or multilayer metal film containing at least one of, for example, aluminum, tungsten, molybdenum, tantalum, chromium, titanium, and copper. The inorganic insulation films 16, 18, and 20 may be made of, for example, a film of silicon oxide or silicon nitride formed by CVD or a stack of these films. The planarization film 21 (interlayer insulation film) may be made of an organic material, such as polyimide or acrylic resin, that can be applied by printing or coating technology and that exhibits a planarization effect.

In the TFT layer 4, transistors TR are formed so as to include the semiconductor layer 15 and the gate electrodes GE. Capacitors Cp are formed between the gate lines GH and the capacitor electrodes CE. FIG. 1 shows the transistor TR as having a bottom-gate structure. The transistor TR may alternatively be have, for example, a top-gate structure.

The light-emitting element layer 5 includes anodes 22, pixel banks (edge covers) 23 covering the edges of the anodes 22, an EL (electroluminescence) layer 24, and cathodes 25 stacked in this sequence. Each pixel bank 23 has an opening (second opening) 23a in which the anode 22 is exposed.

Each subpixel SP includes a self-luminous light-emitting element ES (e.g., an organic light-emitting diode (OLED) or a quantum dot light-emitting diode (QLED)) including the anode 22, the functional layer 24, and the cathode 25. The light-emitting element ES is driven by various wires or lines (e.g., a scan signal line, a data signal line, a light-emission control line, and an EL power supply line) and a pixel circuit (including the transistor TR and the capacitor Cp) formed in the TFT layer 4, to adjust current between the anode 22 and the cathode 25 in accordance with a data signal (gray level signal).

The functional layer 24 (alternatively referred to as the active layer or the EL layer) includes, for example, a hole injection layer, a hole transport layer, a light-emitting layer, a hole blocking layer, an electron transport layer, and an electron injection layer stacked in this sequence. The light-emitting layer is formed by, for example, vapor deposition or inkjet printing technology so as to overlap the openings 23a in the pixel banks 23 that delineate light-emitting regions. One or more of the hole injection layer, the hole transport layer, the electron transport layer, and the electron injection layer may be omitted.

A FMM (fine metal mask) is used in forming the light-emitting layer for OLEDs by vapor deposition. A FMM is a sheet of, for example, an invar material with numerous through holes. An organic material that has passed through a through hole forms an insular light-emitting layer (corresponding to one light-emitting element ES).

An insular QLED light-emitting layer (corresponding to one light-emitting element ES) can be formed, for example, by inkjet printing with a solvent containing diffused quantum dots or by patterning by photolithography the quantum dot layer obtained by applying the solvent using a coater.

The anode 22 includes a stack of, for example, ITO (indium in oxide) and either Ag (silver) or a Ag-containing alloy, so that the anode 22 is light-reflective. The cathode 25 may be formed of a transparent conductive material such as a Mg—Ag alloy (super thin film), ITO, or IZO (indium zinc oxide).

Each pixel bank 23 is arranged in such a manner as to separate adjacent pixels pix. The pixel bank 23 is insulating and made of, for example, an organic material, such as polyimide or acrylic resin, that can be applied by printing or coating technology. The pixel bank 23 is provided so as to cover an edge of the anode 22. The pixel bank 23 serves as an edge cover that prevents short-circuiting between an edge of the anode 22 and the cathode 25 even if the functional layer 24h has a thin edge. The pixel bank 23 serves also as a pixel separation film to prevent current leaks between those pixels pix that are adjacent to each other.

When the light-emitting element ES is an OLED, holes and electrons recombine in the light-emitting layer due to a current between the anode 22 and the cathode 25, to produce excitors that transition to the ground state to emit light. Since the cathode 25 is transparent, and the anode 22 is light-reflective, the light emitted by the functional layer 24 travels upwards, thereby achieving "top emission."

When the light-emitting element ES is a QLED, holes and electrons recombine in the light-emitting layer due to a current between the anode 22 and the cathode 25, to produce excitors that transition from the conduction hand to the valence band of the quantum dot to emit light (fluorescence).

The light-emitting element layer 5 may include light-emitting elements other than the OLED and QLED, such as inorganic light-emitting diodes.

The sealing layer 6 is transparent and includes an inorganic sealing film 26 covering the cathode 25, an organic buffer film (organic film) 27 overlying the inorganic sealing film 26, and an inorganic sealing film 28 overlying the organic buffer film 27. The sealing layer 6, covering the light-emitting element layer 5, prevents foreign material such as water, oxygen, and mobile ions from reaching the light-emitting element layer 5.

The inorganic sealing films 26 and 28 are transparent insulation films and may each include, for example, a film of silicon oxide or silicon nitride formed by CVD or a stack of these films. The organic buffer film 27 is a transparent organic film that exhibits a planarization effect. The organic buffer film 27 may be made of an organic material, such as acrylic resin, that can be applied by printing or coating technology. The organic buffer film 27 may be formed by inkjet printing.

The functional film 29 has, for example, at least one of a protection function, an optical compensation function, and a touch sensor function.

The display device 2 may be flexible, in which case the aforementioned layers are formed on a mother substrate, the mother substrate is thereafter detached, and a film or like body is attached as a support. Then, individual flexible display panels (organic EL display panels) are obtained by cutting out EL display panels from the film carrying stack bodies 7 thereon. The individual EL display panels are fitted with drivers and other circuitry to complete the manufacture of OLED display devices.

Figure 2:
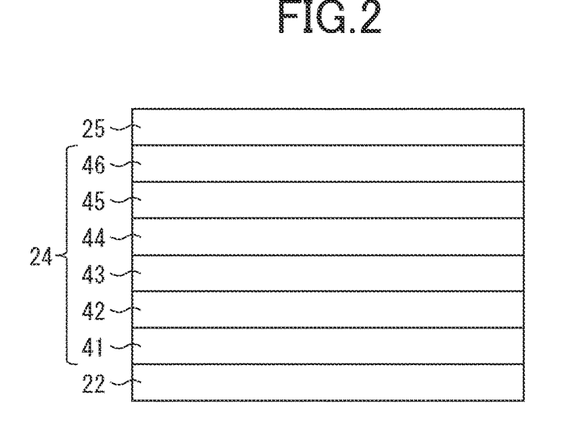
FIG. 2 is a schematic diagram of a structure of a light-emitting element layer.

A description will be given next of a structure of the light-emitting element layer 5 with reference to FIG. 2. FIG. 2 is a schematic diagram of a structure of the light-emitting element layer 5. The light-emitting element layer 5 includes the anode 22, the pixel bank 23, the functional layer 24, and the cathode 25.

The anode 22 feeds holes to the functional layer 24. As shown in FIG 2, the functional layer 24 includes, for example, a hole injection layer 41, a hole transport layer 42, a light-emitting layer 43, a hole blocking layer 44, an electron transport layer 45, and an electron injection layer 46 stacked by vapor deposition in this sequence when viewed from the anode 22. These layers constitute the functional layer 24. The cathode 25 is formed so as to cover the functional layer 24.

Figure 3:
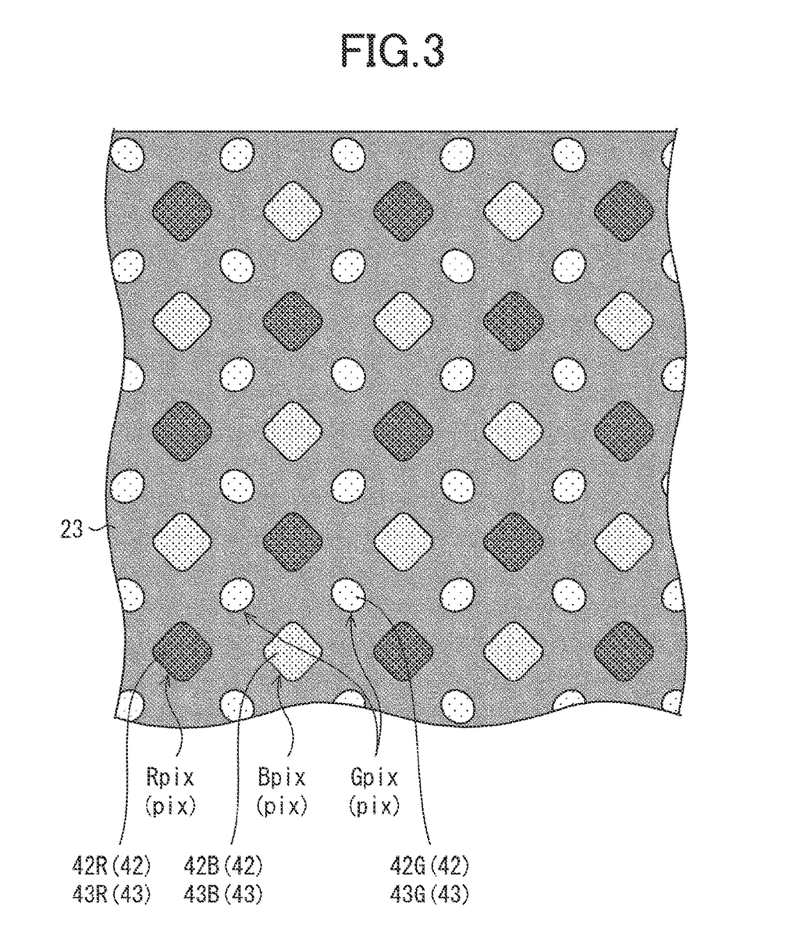
FIG. 3 is an enlarged diagram of a part of the display area.

Referring to FIG. 3, the hole transport layer 42 and the light-emitting layer 43 are provided in an insular manner for each pixel pix by vapor deposition using a vapor deposition mask. FIG. 3 is an enlarged diagram of a part of the display area of the display device in accordance with an embodiment. The layers other than the hole transport layer 42 and the light-emitting layer 43, that is, the hole injection layer 41, the hole blocking layer 44, the electron transport layer 45, the electron injection layer 46, and the cathode 25 are provided as common layers across the pixels pix. One or more of the hole injection layer 41, the hole blocking layer 44, the electron transport layer 45, and the electron injection layer 46 may be omitted. Those layers that are vapor-deposited for each pixel pix using a vapor deposition mask, like the hole transport layer 42 and the light-emitting layer 43, will be referred to as vapor deposition layers.

The light-emitting layer 43 and the hole transport layer 42 are provided for each color of the light emitted by the pixel pix in the pixel pix. For instance, when the pixel pix is a red pixel Rpix that emits red light, a green pixel Gpix that emits green light, or a blue pixel Bpix that emits blue light, the red pixel Rpix includes a red light-emitting layer 43R and a red hole transport layer 42R, the green pixel Gpix includes a green light-emitting layer 43G and a green hole transport layer 42G, and the blue pixel Bpix includes a blue light-emitting layer 43B and a blue hole transport layer 42B, respectively.

The hole injection layer 41 contains a hole injecting material to improve the efficiency of hole injection to the light-emitting layer 43. The hole transport layer 42 contains a hole transporting material to improve the efficiency of hole transport from the anode 22 via the hole injection layer 41 to the light-emitting layer 43. The red hole transport layer 42R improves the efficiency of hole transport to the red light-emitting layer 43R. The green hole transport layer 42G improves the efficiency of hole transport to the green light-emitting layer 43G. The blue hole transport layer 42B improves the efficiency of hole transport to the blue light-emitting layer 43B.

The hole blocking layer 44 contains a hole transport-obstructing material to obstruct hole transport, via the light-emitting layer 43 to the electron transport layer 45. The electron injection layer 46 contains an electron injecting material to improve the efficiency of electron injection to the light-emitting layer 43. The electron transport layer 45 contains an electron transporting material to improve the efficiency of electron transport to the light-emitting layer 43.

The holes injected from the anode 22 to the light-emitting layer 43 and the electrons injected from the cathode 25 to the light-emitting layer 43 recombine in the light-emitting layer 43, to produce excitors that fall from the excited state to the ground state to emit light. By this mechanism, the red light-emitting layer 43R emits red light, the green light-emitting layer 43G emits green light, and the blue light-emitting layer 43B emits blue light.

The red hole transport layer 42R, the red light-emitting layer 43R, the green hole transport layer 42G, the green light-emitting layer 43G, the blue hole transport layer 42B, and the blue light-emitting layer 43B are formed sequentially in the pixel pix by vapor deposition using an individual vapor deposition mask. Any layer that is formed for each pixel pix (in other words, in the opening 23a in the pixel bank 23), including the hole transport layer 42 and the light-emitting layer 43, may be formed using a vapor deposition mask.

FIG. 3 shows, as an example, a PenTile layout of the red pixels Rpix each including the red hole transport layer 42R and the red light-emitting layer 43R, the green pixels Gpix each including the green hole transport layer 42G and the green light-emitting layer 43G, and the blue pixels Bpix each including the blue hole transport layer 42B and the blue light-emitting layer 43B. The pixels are not necessarily arranged in a PenTile layout and may be arranged in, for example, a stripe layout or another layout.

The hole transport layer 42 and the light-emitting layer 43 have the same shape as the opening 23a in the pixel bank 23 in which the light-emitting layer 43 and the hole transport layer 42 are formed. In the example shown in FIG. 3, the red pixels Rpix and the blue pixels Bpix have the same resolution (have the same pixel-to-pixel pitch). In contrast, the green pixels Gpix have a higher resolution than the red pixels Rpix and the blue pixels Bpix (have a smaller pixel-to-pixel pitch). There are some cases like this, where only those pixels pix for a particular one of the colors of emitted light need to have a higher resolution.

The pixels pix do not necessarily emit red, green, and blue light and may emit light of other colors. The pixels pix do not necessarily emit three colors of light and may emit two, four, or more colors of light.

Embodiment 1

Figure 4:
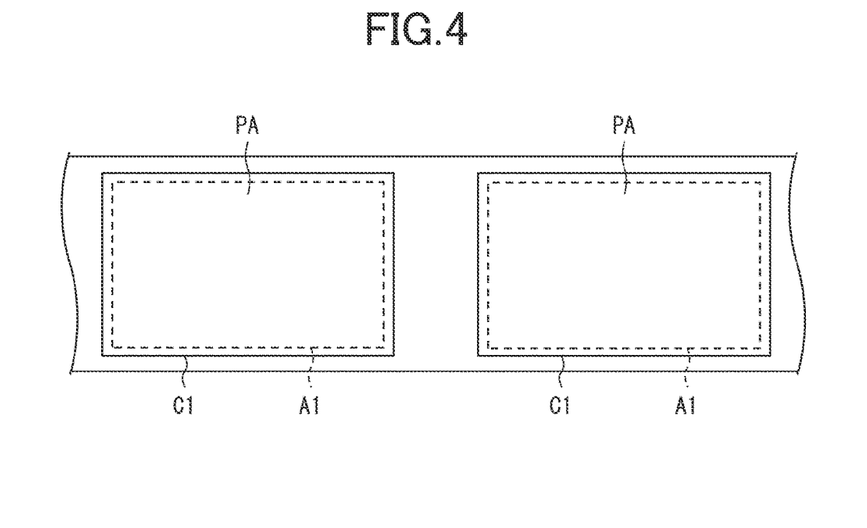
FIG. 4 is a diagram of an effective area of a display panel on a substrate.
Figure 5:
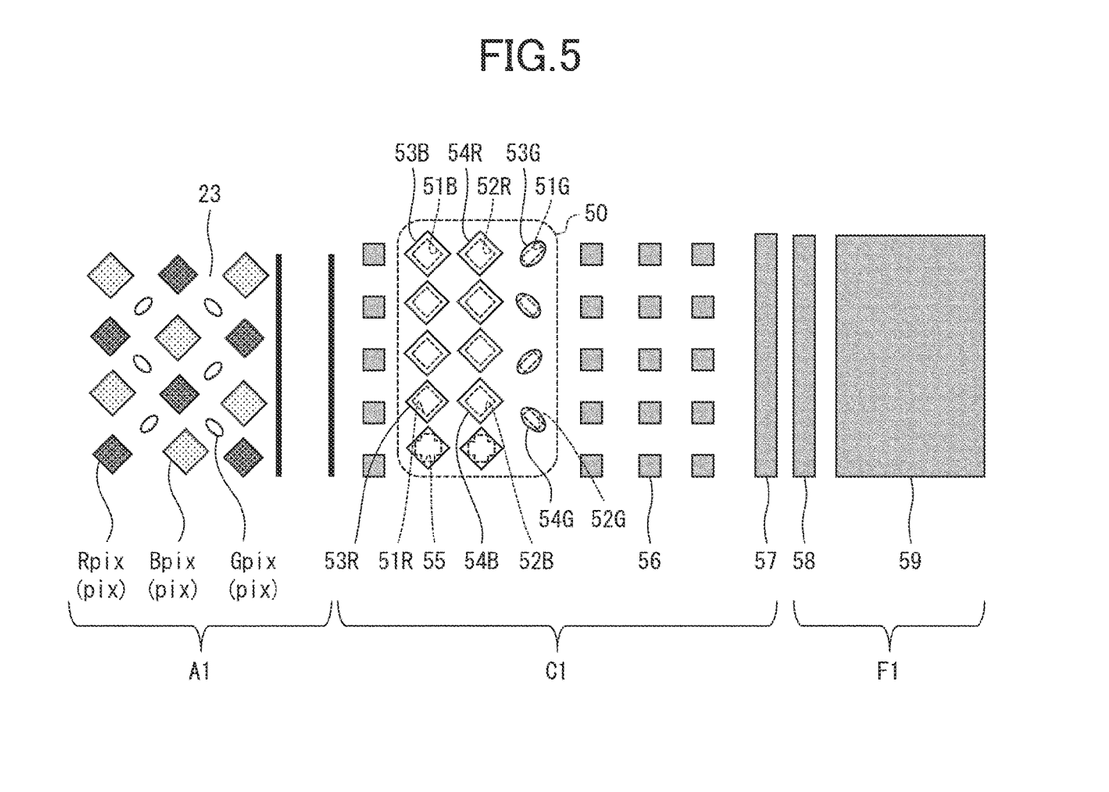
FIG. 5 is a schematic diagram of a structure of the display area and a frame area.
Figure 6:
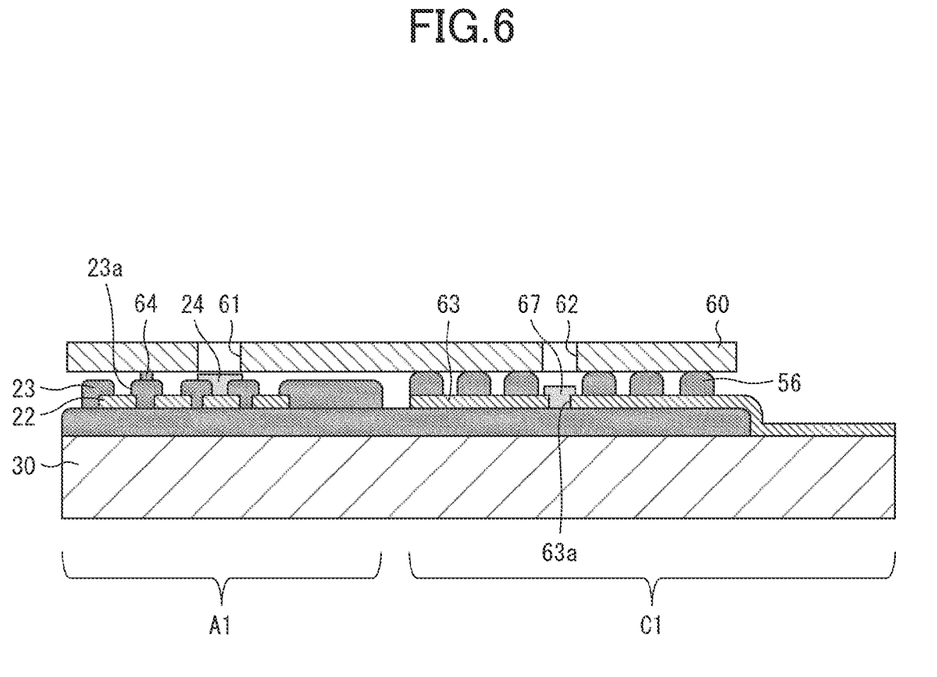
FIG. 6 is a schematic cross-sectional view of the structure of the display area and the frame area.
Figure 7:
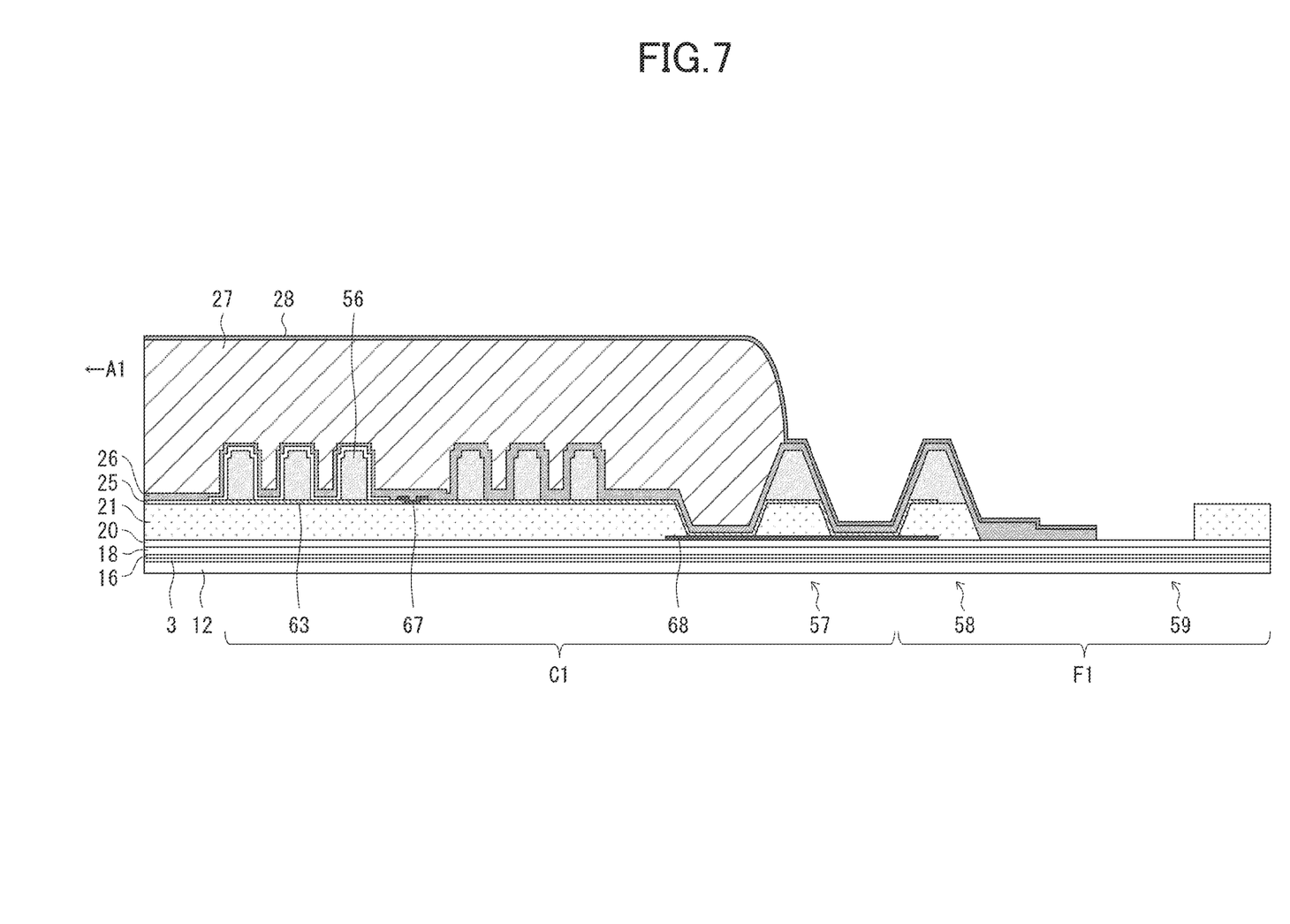
FIG. 7 is an enlarged diagram of a contact area shown in FIG. 6.

The display device 2 includes TEG patterns to manage the vapor deposition process in which the functional layer 24 such as the hole transport layer 42 or the light-emitting layer 43 is formed for each pixel pix by vapor deposition using a vapor deposition mask. The management is done, for example, through the observation of vapor deposition film displacements and layer separation precision. A description is now given of TEG patterns 50 in the display device 2 with reference to FIGS. 4 to 7. FIG. 4 is a diagram of a display panel on the substrate. FIG. 5 is a schematic diagram of a structure of the display area and the frame area. FIG. 6 is a schematic cross-sectional view of the structure of the display area and the frame area. FIG. 7 is an enlarged diagram of a contact area shown in FIG. 6.

FIG. 4 illustrates display panels PA before being cut out of a film or substrate carrying the stack body 7 thereon. Known display device includes TEG patterns for each display panel PA outside the display panel PA. Accordingly, the TEG patterns for checking the separation precision for the functional layer 24 are located away from the display area A1 containing pixels formed by the functional layer 24. The TEG patterns are also few in number for each display panel PA. In addition, the areas outside the display panel PA are flat patterned areas, and it is therefore not possible to check for adverse effects of the shadow created by the height of the pixel bank 23 in the display area A1. It is hence impossible to precisely evaluate the causes for, and solutions (offset) to, color mixing that may occur in the display area A1.

In the display device 2 in accordance with an embodiment, the TEG patterns 50 are provided in a contact area C1 around the display area A1 as shown in FIG. 5. This location of the TEG patterns 50 enables accurate observation of vapor deposition film displacements and layer separation precision near the display area A1, thereby achieving more precise vapor deposition management. The manufactured display device 2 hence exhibits no undesirable color mixing and related defects.

Furthermore, the display device 2 allows for the provision of many TEG patterns 50 in the contact area C1, which stretches along all the four sides of the display area A1, so long as the contact resistance of the contact area C1 (the resistance between the cathodes 25 and the electrode wiring formed near the TFTs on the substrate is tolerated. The display device 2 therefore allows for more effective detection of, for example, local vapor deposition film displacements and shadows.

FIG. 5 is a schematic top view of the display device 2, with parts of the layers on the functional layer 24 being removed to illustrate the TEG pattern 50. Referring to FIG. 5, the frame area F1 resides around the display area A1 of the display device 2. The contact area C1 resides between the display area A1 and the frame area F1, and the cathodes 25 are electrically connected in the contact area C1.

The pixel pix is provided for each color of emitted light in the display area A1. FIG. 5 shows, as an example, the display area A1 where the red pixels Rpix that emit red light, the green pixels Gpix that emit, green light, and the blue pixels Bpix that, emit blue light are separated by the pixel banks 23.

The frame area F1 includes provided therein a first bank (partition wall) 57, a second bank 58, and a sealing area 59 where the inorganic sealing films 26 and 28 in the sealing layer 6 are directly joined. The sealing layer 6 resides across the display area A1, the contact area C1, and the frame area F1 on the cathodes 25 formed after the vapor deposition process. The first bank 57 serves also as a spacer that delineates an edge of the organic film in the sealing layer 6 (i.e., the organic buffer film 27 in FIG. 1).

The contact area C1 resides between the display area A1 and the second bank 58 in the frame area F1. Specifically, as shown in FIG. 7, there is provided a metal film 63 in the contact area C1. The metal film 63 is made of the same material and in the same layer as the anode 22. There is also provided a conductive film 68 in the contact area C1. The conductive film 68 is made of the same material and in the same layer as the source line SH. In the contact area C1, the cathode 25 is electrically connected to the metal film 63 and also to the conductive film 68 via the metal film 63. The conductive film 68 is electrically connected to a low-voltage power supply (ELVSS).

The hole transport layer 42 and the light-emitting layer 43, which are both the functional layers 24, are vapor deposited in the opening 23a in the pixel bank 23 for each pixel pix in the display area A1. Since the anode 22 is exposed in the opening 23a in the pixel bank 23, the functional layer 24 is vapor-deposited on the anode 22. When the TEG pattern 50 is formed by vapor depositing the same material on the metal film 63 in the contact area C1 as the functional layer 24, the functional layer 24 and the TEG pattern 50 are formed by vapor deposition not only closely, but also under similar vapor deposition conditions. This particular structure enables accurate observation of vapor deposition film displacements and layer separation precision in the functional layer 24, thereby achieving more precise vapor deposition management.

In example shown in FIG. 5, the TEG patterns for the hole transport layer 42 and the light-emitting layer 43 are provided for each color of red, green, and blue. In other words, as shown in the contact area C1, particularly in FIG. 7, the TEG patterns residing between an out-of-pixel spacer (out-of-pixel partition wall) 56 overlapping the cathode 25 and the out-of-pixel spacer 56 not overlapping the cathode 25 are formed in an insular manner on the metal film 63 separately for each vapor deposition layer and for each color of the pixels. The TEG patterns hence enable vapor deposition management for each layer and each pixel without being affected by the overlapping of the functional layer 24 and the pixel-to-pixel overlapping of layers.

The metal film 63 on a TFT substrate 30 has openings (first openings) 63a in the present embodiment, as shown in FIG. 6. A vapor deposition film 67 that has TEG patterns is provided over the openings 63a, to form the insular TEG patterns 50 on the metal film 63. In other words, the TEG patterns 50 are formed such that the TEG patterns 50 at least partially overlap the openings 63a in the metal film 63 when viewed from the above with respect to the direction in which the constituent layers of the stack body 7 are stacked. This particular structure enables vapor deposition management for the functional layer(s) 24 through mere evaluation of the vapor deposition of the TEG patterns 50 with reference to the openings 63a in the metal film 63, without having to observe vapor deposition in the pixels pix in the display area A1. FIG. 6 shows an in-pixel spacer 64 in contact with the vapor deposition mask 60 in the display area A1 and the out-of-pixel. spacer 56 in contact with the vapor deposition mask 60 in the frame area F1. The "out-of-pixel spacer" 56 is a spacer in the frame area F1, and the in-pixel spacer 64 is a spacer in the display area A1.

Referring to FIG. 5, the opening 63a in the metal film 63 is provided for each layer and for each color of the pixels. In other words, there are provided an opening 51R for a red hole transport layer, an opening 52R for a red light-emitting layer, an opening 51G for a green hole transport layer, an opening 52G for a green light-emitting layer, an opening 51B for a blue hole transport layer, and an opening 52B for a blue light-emitting layer.

The TEG patterns 50 are formed so as to overlap these openings respectively. In other words, the TEG pattern 50 includes a vapor deposition film 53R made of the same material as the red hole transport layer, a vapor deposition film 54R made of the same material as the red light-emitting layer, a vapor deposition film 53G made of the same material as the green hole transport layer, a vapor deposition film 54G made of the same material as the green light-emitting layer, a vapor deposition film 53B made of the same material as the blue hole transport layer, and a vapor deposition film 54B made of the same material as the blue light-emitting layer.

The hole transport layer 42 and the light-emitting layer 43 are stacked in in the pixel pix and may overlap in adjacent pixels. Overlapping of many films makes it difficult to observe the condition of individual films by evaluating vapor deposition film displacements in the pixels pix through fluorescence (PL) under UV radiation. Since the TEG patterns 50 are provided in an insular manner in the contact area C1 separately for each layer and for each color of the pixels, the display device 2 enables vapor deposition management for each layer and each pixel through observation of the condition of the vapor deposition film under UV radiation on the TEG patterns 50, without being affected by the overlapping of the functional layer 24 and the pixel-to-pixel overlapping of layers. In addition, since the TEG pattern 50 resides on the metal film 63, it becomes easier to detect vapor deposition film displacements when, for example, the metal film 63 is made of highly reflective silver. In the opening 63a in the metal film 63, those parts that do not overlap the TEG pattern 50 emit more light.

The functional layer 24 is vapor-deposited for each pixel pix by a process using the vapor deposition mask 60 shown in FIG. 6. The vapor deposition mask 60 has openings 61 for the openings 23a in the pixel banks 23 and openings 62 for the openings 63a in the metal film 63. The use of the vapor deposition mask 60 in vapor deposition enables the formation of the functional layer 24 for each pixel pix in the display area A1 and the simultaneous formation of the vapor deposition film 67 having the TEG patterns of the same material as the functional layer 24 on the metal film 63 in the contact area C1. If the TEG patterns 50 are provided in the contact area C1 all along the four sides of the display area A1, the vapor deposition mask 60 need to be have the openings 62 on all the corresponding four sides thereof. This particular structure enables well-balanced stretching of the sheet-like vapor deposition mask 60.

After the vapor deposition process using the vapor deposition mask 60, the TEG patterns 50 are illuminated with UV radiation to evaluate the condition of the vapor deposition film 67 to investigate, for example, causes for undesirable color mixing. The locations and size of the openings 61 in the vapor deposition mask 60 for the openings 23a in the pixel banks 23 may be adjusted in view of results of the evaluation to re-design the vapor deposition mask 60, change the stretching conditions of the vapor deposition mask 60, and/or change vapor deposition conditions.

The contact area C1 may include the out-of-pixel spacers 56 as shown in FIGS. 5 and 6. The out-of-pixel spacers 56 are formed so as to surround the display area A1 like a frame. The openings 63a in the metal film 63 are provided between two adjacent out-of-pixel spacers 56. The out-of-pixel spacers 56 are made of the same material and in the same layer as the pixel banks 23.

Variation Example 1

The insular vapor deposition film for the TEG patterns 50 may entirely overlap the opening 63a in the metal film 63 when viewed from the above with respect to the direction in which the constituent layers of the stack body 7 are stacked. In other words, the opening 63a in the metal film 63 may be larger than the insular vapor deposition film 67 for the TEG patterns 50. This particular structure facilitates the observation of the amount of displacement of the vapor deposition film 67 for the TEG patterns 50 relative to the opening 63a in the metal film 63.

The opening 63a in the metal film 63 may have substantially the same shape as the opening 23a in the pixel bank 23 similarly to, for example, the opening 51R corresponding to the red hole transport layer and the opening 52R corresponding to the red light-emitting layer shown in FIG. 5. This particular structure enables more reliable observation of the condition of the vapor deposition of, for example, the pixels pix.

The opening 63a in the metal film 63 may be cross-shaped like opening 55 shown in FIG. 5. This particular structure enables more reliable observation of displacements of the vapor deposition film 67.

Variation Example 2

The opening 63a in the metal film 63 may entirely overlap the insular vapor deposition film 67 for the TEG patterns 50 when viewed from the above with respect to the direction in which the constituent layers of the stack body 7 are stacked. In other words, the opening 63a in the metal film 63 may be smaller than the insular vapor deposition film 67 for the TEG patterns 50. This particular structure facilitates the observation of whether or not the vapor deposition film 67 for the TEG patterns 50 is displaced relative to the opening 63a in the metal film 63.

The opening 63a in the metal film 63 may have substantially the same shape as the opening 23a in the pixel bank 23 and may be cross-shaped in the present variation example, similarly to Variation Example 1.

Embodiment 2

Figure 8:
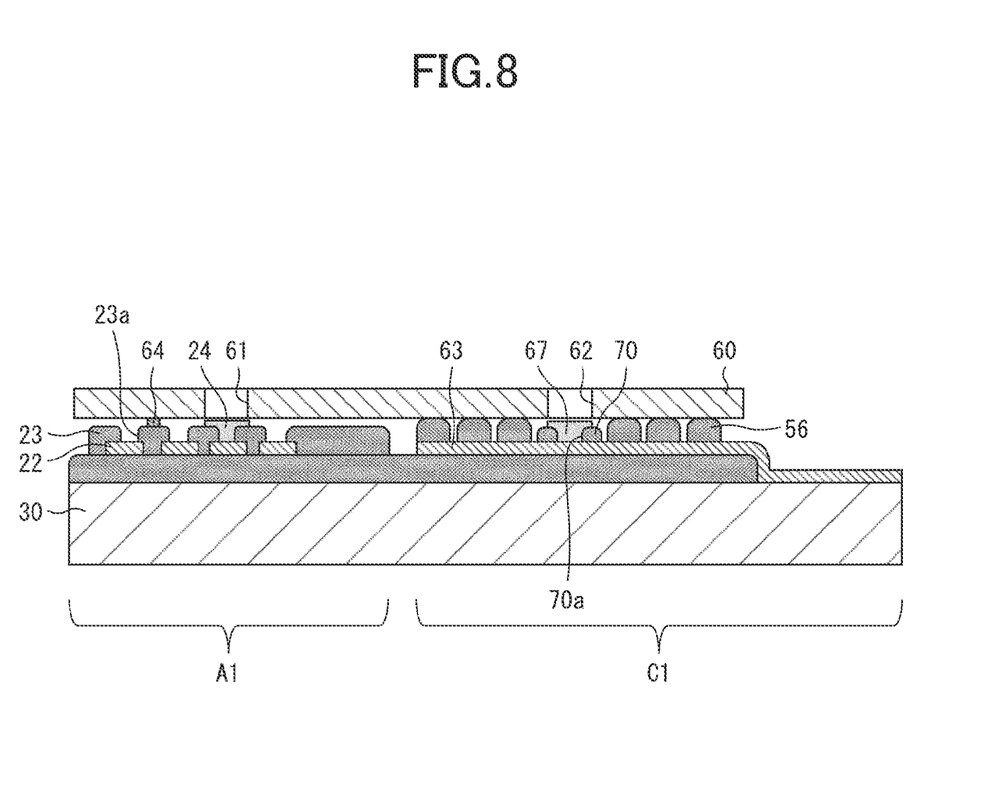
FIG. 8 is a schematic cross-sectional view of a structure of the display area and the frame area.

A description is now given of another embodiment of the present disclosure with reference to FIG. 8. FIG. 8 is a schematic cross-sectional view of a structure of the display area A1 and the frame area F1. As shown in FIG. 8, the present embodiment differs from Embodiment 1 in that the metal film 63 has no opening 63a and also that there is provided an out-of-pixel bank 70 on the metal film 63. The description of the present embodiment therefore will focus on the differences from Embodiment 1 and may skip mentioning similarities.

The out-of-pixel bank 70, similarly to the pixel banks 23, has openings (third openings) 70a in the contact area C1, particularly between the out-of-pixel spacer 56 overlapping the cathode 25 and the out-of-pixel spacer 56 not overlapping the cathode 25. The insular TEG patterns 50 are formed by forming the vapor deposition film 67 for TEG patterns in the openings 70a in the out-of-pixel bank 70. In other words, the TEG patterns 50 are formed so as to at least partially overlap the openings 70a in the out-of-pixel bank 70 when viewed from the above with respect to the direction in which the constituent layers of the stack body 7 are stacked. This particular structure enables vapor deposition management for the functional layer(s) 24 through mere evaluation of the vapor deposition of the TEG patterns 50 with reference to the openings 70a in the out-of-pixel bank 70, without having to observe vapor deposition in the pixels pix in the display area A1. The out-of-pixel bank 70 is made of the same material and in the same layer as the pixel banks 23. The opening 70a in the out-of-pixel bank 70 emits more or less the same amount of light under UV radiation in the portion thereof overlapping the TEG pattern 50 and in the portion thereof not overlapping the TEG pattern 50.

Similarly to Embodiment 1, the opening 70a in the out-of-pixel bank 70 is provided for each layer and for each color of the pixels in the present embodiment. In other words, the opening 51R for a red hole transport layer, the opening 52R for a red light-emitting layer, the opening 51G for a green hole transport layer, the opening 52G for a green light-emitting layer, the opening 51B for a blue hole transport layer, and the opening 52B for a blue light-emitting layer, all shown in FIG. 5, are the openings 70a in the out-of-pixel bank 70. The TEG patterns 50 are provided so as to respectively overlap these openings.

In the present embodiment, the vapor deposition mask 60 has openings 61 for the openings 23a in the pixel banks 23 and openings 62 for the openings 70a in the out-of-pixel bank 70. The use of the vapor deposition mask 60 in vapor deposition enables the formation of the functional layer 24 for each pixel pix in the display area A1 and the simultaneous formation of the vapor deposition film 67 having the TEG patterns of the same material as the functional layer 24 in the contact area C1.

The out-of-pixel bank 70 preferably has a height above the metal film 63 that is lower than the height of the out-of-pixel spacer 56 above the metal film 63. This particular structure allows for such vapor deposition that no vapor deposition film covers the top of the out-of-pixel spacer 56. The structure hence prevents vapor deposited films from coming into contact with the vapor deposition mask 60 in later steps, thereby reducing contamination of the vapor deposition mask 60 and production of foreign objects. The out-of-pixel bank 70 can be made of the same material and in the same layer as the out-of-pixel spacer 56. If the out-of-pixel bank 70 and the out-of-pixel spacer 56 are simultaneously formed by, for example, photolithography using a halftone mask, the structure also advantageously facilitates the manufacture.

Variation Example 3

The insular vapor deposition film for the TEG patterns 50 may entirely overlap the opening 70a in the out-of-pixel bank 70 when viewed from the above with respect to the direction in which the constituent layers of the stack body 7 are stacked. In other words, the opening 70a in the out-of-pixel bank 70 may be larger than the insular vapor deposition film 67 for the TEG patterns 50. This particular structure facilitates the observation of the amount of displacement of the vapor deposition film 67 for the TEG patterns 50 relative to the opening 70a in the out-of-pixel bank 70.

The opening 70a in the out-of-pixel bank 70 may have substantially the same shape as the opening 23a in the pixel bank 23 similarly to, for example, the opening 51R corresponding to the red hole transport layer and the opening 52R corresponding to the red light-emitting layer shown in FIG. 5. This particular structure enables more reliable observation of the condition of the vapor deposition of, for example, the pixels pix.

The opening 70a in the out-of-pixel bank 70 may be cross-shaped like opening 55 shown in FIG. 5. This particular structure enables more reliable observation of displacements of the vapor deposition film.

Variation Example 4

The opening 70a in the out-of-pixel bank 70 may entirely overlap the insular vapor deposition film 67 for the TEG patterns 50 when viewed from the above with respect to the direction in which the constituent layers of the stack body 7 are stacked. In other words, the opening 70a in the out-of-pixel bank 70 may be smaller than the vapor deposition film 67 for the TEG patterns 50, This particular structure facilitates the observation of whether or not the vapor deposition film 67 for the TEG patterns 50 is displaced relative to the opening 70a in the out-of-pixel bank 70.

The opening 70a in the out-of-pixel bank 70 may have substantially the same shape as the opening 23a in the pixel bank 23 and may be cross-shaped in the present variation example, similarly to Variation Example 3.

Method of Manufacturing Display Device

A method of manufacturing a display device in accordance with an embodiment of the present disclosure is a method of manufacturing a display device having a display area and a frame area around the display area, the display area including a stack body including: a TFT layer; a light-emitting element layer including an anode, a functional layer, a cathode, and a pixel bank covering from an opening therein to an edge of the anode; and a sealing layer, the method including: forming a partition wall in the frame area, the partition wall being configured to delineate an edge of an organic film in the sealing layer; forming, between the display area and the partition wall, a contact area in which the cathode is electrically connected to a metal film made of the same material and in the same layer as the anode; and forming, in the contact area, an insular TEG pattern of the same material as the functional layer.

In other words, an embodiment of the method of manufacturing a display device in accordance with the present disclosure is a method of manufacturing the aforementioned display device in accordance with an embodiment of the present disclosure. Therefore, an embodiment of the method of manufacturing a display device in accordance with the present disclosure follows the description of the aforementioned display device in accordance with an embodiment of the present disclosure.

General Description

The present disclosure, in aspect 1 thereof, is directed to a display device (display device 2) having a display area A1 and a frame area F1 around the display area, the display area A1 including a stack body 7 including: a TFT layer 4; a light-emitting element layer 5 including an anode 22, a functional layer 24, a cathode 25, and a pixel bank 23 covering from an opening therein to an edge of the anode; and a sealing layer 6, the sealing layer including at least one organic film 27, there being provided a partition wall (first bank 57) in the frame area, the partition wall being configured to delineate an edge of the organic film, the display device further having, between the display area and the partition wall, a contact area C1 in which the cathode is electrically connected to a metal film 63 made of a same material and in a same layer as the anode, and there being provided an insular TEG pattern 50 in the contact area, the insular TEG pattern 50 being made of a same material as the functional layer.

This structure includes a TEG pattern in the contact area residing around the display area. The structure therefore enables accurate observation of, for example, vapor deposition film displacements and layer separation precision near the display area, thereby achieving more precise vapor deposition management.

In aspect 2 of the present disclosure, the display device of aspect 1 may be configured such that the metal film has a first opening (opening 63a) at least partially overlapped by the TEG pattern when viewed from above with respect to a stacking direction for the stack body. This structure enables vapor deposition management for the functional layer through mere evaluation of the vapor deposition of the TEG pattern with reference to the first opening, without having to observe vapor deposition in a pixel pix in the display area.

In aspect 3 of the present disclosure, the display device of aspect 2 may be configured such that the TEG pattern entirely overlaps the first opening when viewed from above with respect to the stacking direction for the stack body. This structure facilitates the observation of the amount of displacement of the vapor deposition film for the TEG pattern relative to the first opening.

In aspect 4 of the present disclosure, the display device of aspect 3 may be configured such that the first opening is cross-shaped. This structure enables more reliable observation of displacements of the vapor deposition film.

In aspect 5 of the present disclosure, the display device of aspect 3 may be configured such that the first opening is substantially identical in shape to a second opening (opening 23a) in the pixel bank. This structure enables more reliable observation of the condition of the vapor deposition of, for example, a pixel pix.

In aspect 6 of the present disclosure, the display device of aspect 2 may be configured such that the first opening is entirely overlapped by the TEG pattern when viewed from above with respect to the stacking direction for the stack body. This structure facilitates the observation of whether or not the vapor deposition film for the TEG pattern is displaced relative to the first opening.

In aspect 7 of the present disclosure, the display device of aspect 6 may be configured such that the first opening is cross-shaped. This structure enables more reliable observation of displacements of the vapor deposition film.

In aspect 8 of the present disclosure, the display device of aspect 6 may be configured such that the first opening is substantially identical in shape to a second opening in the pixel bank. This structure more reliable observation of the condition of the vapor deposition of, for example, a pixel pix.

In aspect 9 of the present disclosure, the display device of any one of aspects 2 to 8 may be configured such that the contact area further including, on the metal film, an out-of-pixel partition wall (out-of-pixel spacer 56) overlapping the cathode and an out-of-pixel partition wall (out-of-pixel spacer 56) not overlapping the cathode, wherein the TEG pattern resides between the out-of-pixel partition wall overlapping the cathode and the out-of-pixel partition wall not overlapping the cathode. This structure enables vapor deposition management for the functional layer through mere evaluation of the vapor deposition of the TEG pattern residing between the out-of-pixel partition wall overlapping the cathode and the out-of-pixel partition wall not overlapping the cathode, without having to observe vapor deposition in a pixel pix in the display area.

In aspect 10 of the present disclosure, the display device of aspect 1 may be configured such that there being further provided an out-of-pixel bank 70 on the metal film, the out-of-pixel bank having a third opening (opening 70*a*), wherein the TEG pattern at least partially overlaps the third opening when viewed from above with respect to a stacking direction for the stack body. This structure enables vapor deposition management for the functional layer through mere evaluation of the vapor deposition of the TEG pattern with reference to the third opening, without having to observe vapor deposition in a pixel pix in the display area.

In aspect 11 of the present disclosure, the display device of aspect 10 may be configured such that the TEG pattern entirely overlaps the third opening when viewed from above with respect to the stacking direction for the stack body. This structure facilitates the observation of the amount of displacement of the vapor deposition film for the TEG pattern relative to the third opening.

In aspect 12 of the present disclosure, the display device of aspect 11 may be configured such that the third opening is cross-shaped. This structure enables more reliable observation of displacements of the vapor deposition film.

In aspect 13 of the present disclosure, the display device of aspect 11 may be configured such that the third opening is substantially identical in shape to a second opening in the pixel bank. This structure enables more reliable observation of the condition of the vapor deposition of, for example, a pixel pix.

In aspect 14 of the present disclosure, the display device of aspect 10 may be configured such that the third opening is entirely overlapped by the TEG pattern when viewed from above with respect to the stacking direction for the stack body. This structure facilitates the observation of whether or not the vapor deposition film for the TEG pattern is displaced relative to the third opening.

In aspect 15 of the present disclosure, the display device of aspect 14 may be configured such that the third opening is cross-shaped. This structure enables more reliable observation of displacements of the vapor deposition film.

In aspect 16 of the present disclosure, the display device of aspect 14 may be configured such that the third opening is substantially identical in shape to a second opening in the pixel bank. This structure enables more reliable observation of the condition of the vapor deposition of, for example, a pixel pix.

In aspect 17 of the present disclosureinvention, the display device of any one of aspects 10 to 16 may be configured such that the contact area further including at least one out-of-pixel partition wall on the metal film, wherein the out-of-pixel bank has a lower height above the metal film than do the at least one out-of-pixel partition wall above the metal film.

This structure allows for such vapor deposition that no vapor deposition film covers the top of the out-of-pixel spacer. The structure hence prevents vapor deposited films from coming into contact with the vapor deposition mask 60 in later steps, thereby reducing contamination of the vapor deposition mask and production of foreign objects.

In aspect 18 of the present disclosure, the display device of aspect 17 may be configured such that the at least one out-of-pixel partition wall including an out-of-pixel partition wall overlapping the cathode and an out-of-pixel partition wall not overlapping the cathode, the TEG pattern resides between the out-of-pixel partition wall overlapping the cathode and the out-of-pixel partition wall not overlapping the cathode. This structure enables vapor deposition management for the functional layer through mere evaluation of the vapor deposition of the TEG pattern residing between the out-of-pixel partition wall overlapping the cathode and the out-of-pixel partition wall not overlapping the cathode, without having to observe vapor deposition in a pixel pix in the display area.

In aspect 19 of the present disclosure, the display device of aspect 17 or 18 may be configured such that the out-of-pixel bank is made of a same material and in a same layer as the at least one out-of-pixel partition wall. This structure facilitates the formation of the out-of-pixel bank and the out-of-pixel partition wall.

In aspect 20 of the present disclosure, the display device of any one of aspects 10 to 19 may be configured such that the pixel bank is made of a same material and in a same layer as the out-of-pixel bank. This structure facilitates the formation of the pixel bank and the out-of-pixel bank.

In aspect 21 of the present disclosure, the display device of any one of aspects 1 to 20 may be configured such that the functional layer includes a light-emitting layer. This structure enables precise evaluation of the condition of the vapor deposition of the light-emitting layer.

In aspect 22 of the present disclosure, the display device of any one of aspects 1 to 21 may be configured such that the functional layer includes a hole transport layer. This structure enables precise evaluation of the condition of the vapor deposition of the hole transport layer.

The present disclosure, in aspect 23 thereof, is directed to a method of manufacturing a display device having a display area and a frame area around the display area, the display area including a stack body including: a TFT layer; a light-emitting element layer including an anode, a functional layer, a cathode, and a pixel bank having an opening in which the anode resides; and a sealing layer, the method including: forming a partition wall configured to delineate an edge of an organic film in the sealing layer in the frame area; forming, between the display area and the partition wall, a contact area in which the cathode is electrically connected to a metal film made of a same material and in a same layer as the anode; and forming, in the contact area, an insular TEG pattern of a same material as the functional layer.

This structure achieves similar advantage to those achieved by the display device of aspect 1 in accordance with the present disclosure.

The present disclosure is not limited to the description of the embodiments above and may be altered within the scope of the claims. Embodiments based on a proper combination of technical means disclosed in different embodiments are encompassed in the technical scope of the present disclosure. Furthermore, new technological features can be created by combining different technical means disclosed in the embodiments.

The invention claimed is:

1. A display device comprising a display area and a frame area around the display area, the display area including a stack body including: a thin-film transistor (TFT) layer; a light-emitting element layer including an anode, a functional layer, a cathode, and a pixel bank covering an edge of the anode; and a sealing layer;
the sealing layer including at least one organic film, and a partition wall provided in the frame area, the partition wall being configured to delineate an edge of the at least one organic film;
the display device further comprising, between the display area and the partition wall, a contact area in which the cathode is electrically connected to a metal film made of a same material and in a same layer as the anode; and
an insular test element group (TEG) pattern provided in the contact area, the insular TEG pattern being made of a same material as the functional layer, wherein
the metal film has a first opening at least partially overlapped by the insular TEG pattern when viewed from above with respect to a stacking direction for the stack body.

2. The display device according to claim 1, wherein the insular TEG pattern entirely overlaps the first opening when viewed from the above with respect to the stacking direction for the stack body.

3. The display device according to claim 2, wherein the first opening is cross-shaped.

4. The display device according to claim 2, wherein the first opening is substantially identical in shape to a second opening in the pixel bank.

5. The display device according to claim 1, wherein the first opening is entirely overlapped by the insular TEG pattern when viewed from the above with respect to the stacking direction for the stack body.

6. The display device according to claim 5, wherein the first opening is cross-shaped.

7. The display device according to claim 5, wherein the first opening is substantially identical in shape to a second opening in the pixel bank.

8. The display device according to claim 1, wherein:
the contact area includes, on the metal film, a first out-of-pixel partition wall overlapping the cathode and a second out-of-pixel partition wall not overlapping the cathode, and
the insular TEG pattern resides between the first out-of-pixel partition wall and the second out-of-pixel partition wall.

9. The display device according to claim 1, wherein the functional layer includes a light-emitting layer.

10. A display device comprising a display area and a frame area around the display area, the display area including a stack body including: a thin-film transistor (TFT) layer; a light-emitting element layer including an anode, a functional layer, a cathode, and a pixel bank covering an edge of the anode; and a sealing layer;
the sealing layer including at least one organic film, and a partition wall provided in the frame area, the partition wall being configured to delineate an edge of the at least one organic film;
the display device further comprising, between the display area and the partition wall, a contact area in which the cathode is electrically connected to a metal film made of a same material and in a same layer as the anode;
an insular test element group (TEG) pattern provided in the contact area, the insular TEG pattern being made of a same material as the functional layer; and
an out-of-pixel bank provided on the metal film, the out-of-pixel bank having a first opening, wherein
the insular TEG pattern at least partially overlaps the first opening when viewed from above with respect to a stacking direction for the stack body.

11. The display device according to claim 10, wherein the insular TEG pattern entirely overlaps the first opening when viewed from the above with respect to the stacking direction for the stack body.

12. The display device according to claim 11, wherein the first opening is cross-shaped.

13. The display device according to claim 11, wherein the first opening is substantially identical in shape to a second opening in the pixel bank.

14. The display device according to claim 10, wherein the first opening is entirely overlapped by the insular TEG pattern when viewed from the above with respect to the stacking direction for the stack body.

15. The display device according to claim 14, wherein the first opening is cross-shaped.

16. The display device according to claim 14, wherein the first opening is substantially identical in shape to a second opening in the pixel bank.

17. The display device according to claim 10, wherein:
the contact area includes at least one out-of-pixel partition wall on the metal film, and
the out-of-pixel bank has a lower height above the metal film than do the at least one out-of-pixel partition wall above the metal film.

18. The display device according to claim 17, wherein:
the at least one out-of-pixel partition wall includes a first out-of-pixel partition wall overlapping the cathode and a second out-of-pixel partition wall not overlapping the cathode, and
the insular TEG pattern resides between the first out-of-pixel partition wall and the second out-of-pixel partition wall.

19. The display device according to claim 17, wherein the out-of-pixel bank is made of a same material and in a same layer as the at least one out-of-pixel partition wall.

20. The display device according to claim 10, wherein the pixel bank is made of a same material and in a same layer as the out-of-pixel bank.

* * * * *